United States Patent [19]

Harmer et al.

[11] Patent Number: 5,304,535
[45] Date of Patent: Apr. 19, 1994

[54] ETCHING OF NANOSCALE STRUCTURES ON HIGH TEMPERATURE SUPERCONDUCTORS

[75] Inventors: Mark A. Harmer, Wilmington; Bruce A. Parkinson, Hockessin, both of Del.

[73] Assignee: E. I. du Pont de Nemours and Company, Wilmington, Del.

[21] Appl. No.: 604,981

[22] Filed: Oct. 29, 1990

[51] Int. Cl.$^5$ .......................................... H01L 21/00
[52] U.S. Cl. .................................. 505/410; 505/701; 505/702; 505/728; 427/62; 427/63; 156/643; 156/655; 156/656; 250/492.2
[58] Field of Search ................... 505/701, 702, 728, 1; 427/62, 63; 156/643, 646, 655, 656; 250/492.2

[56] References Cited

U.S. PATENT DOCUMENTS

| | | | |
|---|---|---|---|
| 4,343,993 | 8/1982 | Binnig et al. | 250/306 |
| 4,550,257 | 10/1985 | Binnig et al. | 250/492.4 |
| 4,829,507 | 5/1989 | Kazan et al. | 369/126 |
| 4,896,044 | 1/1990 | Li et al. | 250/492.3 |
| 4,956,335 | 9/1990 | Agostinelli et al. | 156/630 |
| 4,966,885 | 10/1990 | Hebard | 505/1 |
| 5,015,323 | 5/1991 | Gallagher | 156/643 |
| 5,021,672 | 6/1991 | Parkinson | 250/492.2 |

FOREIGN PATENT DOCUMENTS

| | | |
|---|---|---|
| 63-60196 | 3/1988 | Japan. |
| 63-232333 | 9/1988 | Japan. |
| 63-271743 | 11/1988 | Japan. |

OTHER PUBLICATIONS

"Atomic-Scale Surface Modifications Using a Tunnelling Microscope"; Nature; vol. 325, Jan. 29, 1987, pp. 419-421.
"Topography and Local Modification of the HoBa$_2$Cu$_3$O$_{7-x}$ (001) Surface Using Scanning Tunneling Microscopy"; Appl Phys. Lett; vol. 53; No. 24, Dec. 12, 1988; pp. 2447-2449.
Harmer et al., J. Appl. Phys., vol. 70, No. 5, Sep. 1991.
Parks et al., Appl. Phys. Lett., vol. 59, No. 12, Sep. 1991.
Heinzelmann et al., Appl. Phys. Lett., vol. 53, No. 24, Dec. 1988.
Wichramasinghe, H. K., Scientific American, 98–105, Oct. (1989).
Rabe, J. P., Agnew. Chem. Int. Ed. Engl., 28(1): 117–122 (1989).
Hansma, P. K., et al., Science, 242: 209–216 (1988).
McCord, M. A. et al., J. Vac. Sci. Technol. B6(1):86–88 (1986).
McCord, M. A. et al., J. Vac. Sci. Technol. B6(1):292–296 (1988).
Research Disclosure No. 28130, Sep. (1987).
Schneir, J. et al., J. Appl. Phys., 63(3): 717–721 (1988).
Schneir, J. et al., Langmuir, 3: 1025-1027 (1987).
McCord, M. A. et al., J. Vac. Sci. Technol., B6(6): 1977–1880 (1988).
Emch, R. et al., J. Appl. Phys., 65(1): 79–84 (1989).
Staufer, U. et al., J. Vac. Sci. Technol., A6:537–539 (1988).
Ringger, M. et al., Appl. Phys. Lett., 46(9): 832–834 (1985).
van Loener, E. J., et al., Appl. Phys. Lett., 55(13): 1312–1314 (1989).
Jaklevic, R. C. et al., Phys. Rev. Lett., 60(2): 120–123 (1988).
Garfunkel, E. et al., Science, 246: 99–100 (1989).
Becker, R. S. et al., Nature, 325: 419–421 (1987).
Laiho, R. et al., Journal of Microscopy, 152(2): 407–413, Nov. (1988).
Heinzelmann, H. et al., Journal of Microscopy, 152(2): 399–405, Nov. (1988).
Heinzelmann, H., et al., Appl. Phys. Lett., 53(24): 2447–2449, Dec. (1988).
Albrecht, T. R., et al., G. L. Report No. 4526 Preprint, Jun. (1989).

Primary Examiner—Brian E. Hearn
Assistant Examiner—George Goudreau
Attorney, Agent, or Firm—Susan B. Evans

[57] ABSTRACT

A process for etching with a scanning tunneling microscope on both a single crystal and a thin film of high temperature superconductor is disclosed.

13 Claims, 7 Drawing Sheets

ETCHING OF NANOSCALE STRUCTURES ON HIGH TEMPERATURE SUPERCONDUCTORS

FIELD OF THE INVENTION

The present invention relates to a process for the etching of both single crystal and thin film superconductors with a scanning tunneling microscope. Nanoscale features can be generated by ablation of atoms rastered by the microscope tip. The etching process can be controlled to selectively remove layers of material along the a-b plane. Surface features as small as 30 nm wide by 3.6 nm deep have been fabricated.

BACKGROUND OF THE INVENTION

The scanning tunneling microscope, hereinafter STM, is an instrument capable of resolving surface detail down to the atomic level. The microscope's conductive tip, ideally terminating in a single atom, traces the contours of a surface with atomic resolution. The tip is maneuvered to within a nanometer or so of the surface of a conducting substrate so that the electron clouds of the atom at the probe tip overlap that of the nearest atom of the sample. When a small voltage is applied, electrons tunnel across the gap between the microscope tip and the substrate, generating a tunneling current the magnitude of which is sensitive to the size of the gap. Typically the tunneling current decreases by a factor of 10 each time the gap is widened by 0.1 nanometer.

Movement of the microscope tip is controlled by piezoelectric controls. In one mode of operation, the tip or probe is held at a constant height as it is moved horizontally back and forth across the sample surface in a raster pattern, its parallel tracks separated by a fraction of a nanometer. This causes the tunneling current to fluctuate and the current variation is measured and translated into an image of the surface. The current increases when the tip is closer to the surface, as when passing over bumps such as a surface atom, and decreases when the tip is farther from the surface, as when passing over gaps between atoms. In an alternative mode of operation, the probe or tip moves up and down in concert with the surface topography as it is moved across the surface in a raster pattern. Its height is controlled to maintain a constant tunneling current between the tip and the surface. The variations in voltage required to maintain this constant gap are electronically translated into an image of surface relief.

The image obtained by either mode of operation is not a topographical map of the surface, but a surface of constant tunneling probability affected by the variations in the occurrence and energy levels of the electrons present in the surface atoms. If the surface is composed of a single type of atom, the image may closely resemble topography, but when various atoms are present pits or bumps will appear in the image depending upon their electronic structures.

Further detail on the structure and operation of the STM is disclosed in U.S. Pat. No. 4,343,993 of Binnig et al issued Aug. 10, 1982; Wickramasinghe, H. K., Scientific American, October (1989) pp. 98–105; Rabe, J. P., Angew. Chem. Int. Ed. Engl. 28 (1989) No. 1, pp. 117–122; and Hansma et al., Science, 242, Oct. 14, 1988, pp. 209–216.

The STM is useful not only for the imaging or characterization of surfaces, but also for manipulating surfaces on a scale as small as subnanometers. STM is limited to imaging or manipulating surfaces which conduct electrons. Therefore, thin conductive coatings or replicas have been used on substrate surfaces which are nonconducting. See McCord et al., J. Vac. Sci. Technol. B 4 (1), 86–88 (1986); McCord et al., J. Vac. Sci. Technol. B 6(1), 293–296 (1988); Research Disclosure 28130, September 1987; Schneir et al., J. Appl. Phys., 63, 717–721 (1988); and Schneir et al., Langmuir, 3, 1025–1027 (1987).

Metal deposition onto a substrate surface from a gas is another method which has been used to pattern lines using the STM. See McCord et al., J. Vac. Sci. Technol. B 6, 1877–1880 (1988); Japan Patent Application 63-271,743 published Nov. 9, 1988; and U.S. Pat. No. 4,550,257 of Binnig et al., issued Oct. 29, 1985. Metal deposition onto gold is taught by Emch et al., J. Appl. Phys., 65, 79–84 (1989). Deposition of particles onto the surface from a carrier is disclosed in U.S. Pat. No. 4,829,507 of Kazan et al. issued May 9, 1989.

The formation of protrusions or raised surface areas on metallic glasses by local heating using the STM has also been reported as a means of nanometer lithography by Staufer et al., J. Vac. Sci. Technol., A 6, 537–539 (1988) and Ringger et al., Appl. Phys. Lett. 46, 832–834 (1985).

Writing using the STM wherein the microscope tip physically touches, scratches, indents, or creates holes in the substrate surface has been taught by Van Loenen et al., Appl. Phys. Lett., 55, (13), 1312–1413, Sep. 25, 1989; Jaklevic et al., Physical Review Letters, 60, 120–123 (1988); and Garfunkel et al., Science, 246, 99–100, Oct. 6, 1989.

Another approach to writing with the STM has been to use the tunneling current for surface rearrangement of the atoms already present. Such lithography has not been reliably reproducible. See Becker et al., Nature, 325, 419–421 (1987), and Japan Patent Application 63-60,196 published Mar. 16, 1988.

The ability to manipulate single atoms or molecules with the STM provides unique potential applications in microelectronics. Much of the current interest in high temperature superconductors is related to their use in electronic applications. One important criterion in this area is the ability to make extremely fine structures such as junction devices. Also of great importance is the surface chemistry and surface morphology of these materials.

R. Laiho et al., Journal of Microscopy, Vol. 152, Part 2, pp. 407–413, November (1988) disclose investigation of the surface structures of the high temperature superconductors $YBa_2Cu_3O_{7-x}$, $Bi-Ca_{1.7}Sr_{0.7}Cu_2O_x$ and $TlCaBaCuO_{4.5 \pm x}$ using STM. H. Heinzelmann et al., Journal of Microscopy, Vol. 152, Part 2, pp. 399–405, November (1988) discuss use of STM and of AFM (atomic force microscopy) at room temperature and pressure to investigate the surface of single crystal $YBa_2Cu_3O_{7-x}$ high temperature superconductors. Both of these references teach imaging or characterization of surfaces but no means of etching or lithography on these superconducting substrates.

H. Heinzelmann et al., App. Phys. Lett., Vol. 53, No. 24, p. 2447 (1988) disclose investigation of the topography of the surface of the high temperature superconductor $HoBa_2Cu_3O_{7-x}$ single crystal using STM. Surface features have been modified on this material using STM at a high threshold voltage ($\geq 2.0$ V). This work was done only on single crystals. Etching by multiples of layers (a few angstroms) was not demonstrated and the resulting etch pattern was irregularly shaped indicating an uncontrolled process. Thin films may be of more practical use for devices.

It is therefore an object of the present invention to provide a process for etching of nanoscale structures using STM on a high temperature single crystal or thin film superconductor.

It is a further object of the present invention to provide a lithography process using a STM on a single crystal or thin film superconductor which requires no post writing treatment to stabilize the image.

It is a further object of the present invention to provide a lithography process using a STM on a single crystal or thin film superconductor which can controllably remove one or more layers in the a-b plane and which does not destructively deform the superconductor.

SUMMARY OF THE INVENTION

The present invention comprises a process for etching a structure using the scanning tunneling microscope (STM) to etch surface features on either a single crystal or thin film of a high temperature superconductor. The tunneling voltage is varied from $-5$ to $+5$ volts and a current up to 100 nanoamps is applied to generate the controlled ablation of one or more layers in the a-b plane of the superconductor. By repeated scanning of these surfaces, holes can be generated by rastering with the STM tip. Surface features as small as 30 nm wide by 3.6 nm deep have been fabricated. Examples include square or rectangular etched features. The resulting removal of the atoms by the microscope tip can be viewed simultaneously with the rastering, thereby providing selective control of the precise depth of ablation.

DETAILED DESCRIPTION OF THE INVENTION

Figure 1:
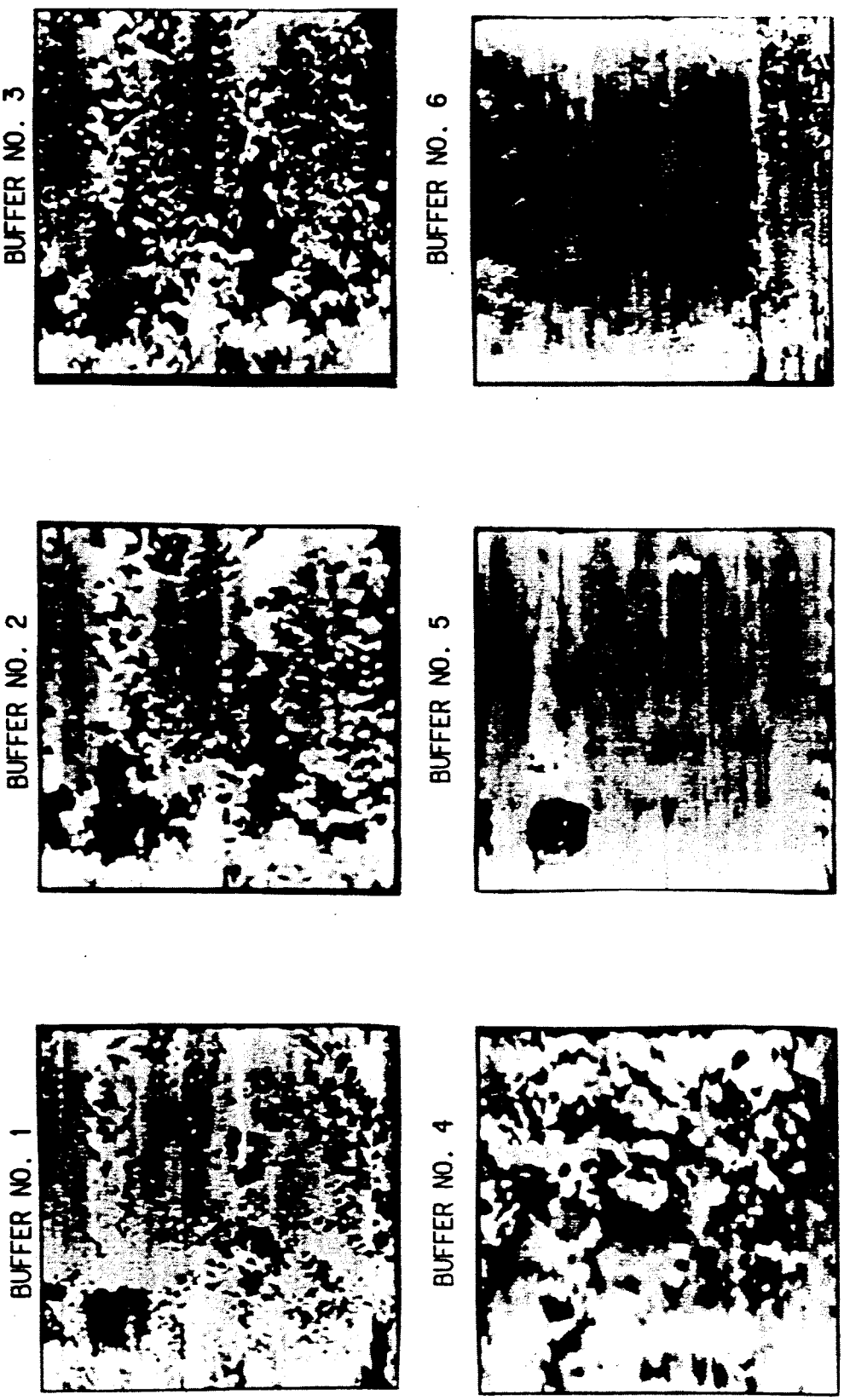
FIG. 1 shows the etching using a STM on a single crystal of $YBa_2Cu_3O_{7-x}$ resulting from Example 1. The areas designated buffer 1 to buffer 5 show the removal of a layer. The area designated buffer 6 shows the beginning of etching of the next layer.

The term "etching" as used hereinafter shall mean the ablation of one or more layers in the a-b plane depending upon the voltage and the area scanned.

The term "superconductor" refers to a material whose resistance decreases to zero and/or becomes perfectly diamagnetic and excludes a magnetic field, this effect being known as the Meissner effect.

The term "layer" denotes one or more covalent copper oxygen planes with the associated cations found in high $T_c$ superconductors.

The term "ablation" as used herein means the removal or disappearance of atoms leaving behind no residue or deformation.

The term "STM" means scanning tunneling microscope.

The term "holes" as used herein means the space left upon ablation of atoms of one or more unit cell layers of superconductor, the dimensions of which will vary depending upon the etch conditions.

The term "structure" as used herein means the etched image, figures, letters or drawings created by the process of the present invention.

The term "substrate" as used herein refers to the materials on which the superconductor is prepared in the case of thin films.

The present invention comprises a process for the sequential etching of one or more layers of superconductor. The material etched is either a single crystal or a highly oriented film on a substrate. In both cases the superconductor is mounted with the a-b crystallographic plane perpendicular to the STM tip such that on rastering the tip follows the a-b plane. Since the ablation can be viewed while etching, very precise control or manipulation of the scope and the depth of etching can be achieved in a reliable and reproducible manner. By varying the etching conditions structures as small as 30 nm wide and 3.6 nm deep to as large as one micrometer wide by 100 nm deep have been created. The superconductor is not destructively deformed. Further, no post writing treatment is required to stabilize the image.

In the process of the present invention the superconductor can be etched by one layer at a time, in a very controlled fashion, by scanning the tip of the tunneling microscope over the surface, preferably in air, at typical values of tunneling current and voltage. Multiple layers may also be removed by varying the etching conditions of voltage, current, scan rate and area of scan. Shape is controlled with the raster pattern of the microscope. By varying the size and the position of the raster pattern, complex features can be produced. Repeat units of a unit cell layer of the surface of the material can be removed and this can be viewed while etching. The etching can be continued until the next layer begins to etch and the process repeated.

The etched region appears as the nucleation and growth of holes as the microscope tip scans the surface. The etch rate is more rapid at defect sites and at the edges adjacent to where material has been previously etched. As the etching progresses the whole layer can be observed to be removed and the next layer then beings to etch in the same manner. The image during this process remains clear, and the depth of the etch can be controlled by varying the time of etch allowing single layers or multiple layers to be etched. In general sharp features or islands are etched more rapidly than smooth areas. Analysis of the depth information in a constant current scan of an etched area usually reveals that the step height is consistent with the removal of layers of the superconductor. Repeated etching produces step heights of multiple layers.

The etching process defined in the present invention has been applied to both single crystal and thin film superconductors. Specific instrumental operating parameters will be defined hereinafter. Within the parameters defined, this technique is applicable to materials within the class of high temperature superconductor compounds. Suitable high temperature superconductors for use herein comprise copper oxides. Examples of such superconductors include the yttrium superconductors of the Y—Ba—Cu—O type; the lanthanum superconductors of the La—Sr—Cu—O or La—Ba—Cu—O types; the bismuth superconductors of the Bi—Sr—Ca—Cu—O type; and the thallium superconductors of the Tl—Ba—Ca—Cu—O type.

Preferred for use herein are the yttrium superconductors and, in particular the compounds with the formula $YBa_2Cu_3O_{7-x}$, wherein x is from 0 to 1. It is well-known that when x is from 0 to about 0.5, the $YBa_2Cu_3O_{7-x}$ compounds have orthorhombic symmetry with space group Pmmm and are superconducting. When x is from about 0.5 to 1, the $YBa_2Cu_3O_{7-x}$ compounds have tetragonal symmetry with space group P4/mmm and are nonsuperconducting. (See, for example, Müller-Buschbaum, Angew. Chem. Int. Ed. Engl., Vol. 28, pp. 1472-1493, 1989). The tetragonal phase is readily converted to the orthorhombic phase by heating in an oxygen-containing atmosphere at a temperature from about 300° C. to about 600° C. and then cooling in an oxygen-containing atmosphere. The c-axis of the unit cell of all of these compounds is about 1.2 nm, and step heights of 1.2 nm are obtained with repeated etching of layers. Superconductors with etched surfaces can be made by either directly etching the surface orthorhombic phase $YBa_2Cu_3O_{7-x}$ or by etching the surface of tetragonal phase $YBa_2Cu_3O_{7-x}$ and converting it to the superconducting phase with the heat treatment discussed. The etched features will be essentially retained when the material is converted. Therefore the high temperature superconductor used in the process of the invention is understood to include both the orthorhombic superconducting $YBa_2Cu_3O_{7-x}$ phase and the tetragonal $YBa_2Cu_3O_{7-x}$ phase which is subsequently converted to a superconductor by the heat treatment discussed. As x increases and the oxygen content decreases, the $T_c$ decreases from about 90° to 95° when x is zero to about 60° when x is about 0.4. Therefore, especially preferred are the superconductors $YBa_2Cu_3O_{7-x}$ with x of 0, i.e., $YBa_2Cu_3O_{7-x}$, to x of about 0.1.

A second class of superconductors useful in the present invention are the copper oxide based lanthanum superconductors. The compounds are of the formula $La_{2-y}Sr_yCuO_4$ wherein y is from about 0.1 to about 0.2, for example, $La_{1.85}Sr_{0.15}CuO_4$. The c-axis of the unit cell for these compounds is about 1.32 nm and the $T_c$ ranges from about 30° to 40° K. Further information on this compound type is in Grant, Adv. Mater., Vol. 2, No. 5, pp. 232-253 (1990), herein incorporated by reference.

A third type of superconductor suitable for use in the present invention is the bismuth superconductor of the Bi—Sr—Ca—Cu—O type. Examples of such compounds include $Bi_2(Sr_{1-x}Ca_x)_2CuO_{8-y}$, $Bi_2(Sr_{1-x}Ca_x)_3Cu_2O_{10-y}$, and in particular $Bi_2Sr_{3-x}Ca_{n-2+x}Cu_nO_{2n+4}$ wherein n is 2 or 3 and x is from about 0.7 to about 1. For this class of compounds the c-axis of the unit cell is about 3.1 to 3.3 nm and it contains more than one layer of Cu—O planes. The $T_c$ varies from about 80° to 110° K. Further information on bismuth, yttrium, and lanthanum superconductors is in Muller-Buschbaum, Angew. Chem. Int. Ed. Engl., Vol. 28, pp. 1472-1493 (1989), herein incorporated by reference.

A fourth type of superconductor suitable for use in the present invention is thallium superconductors. Typical compositions include $TlBa_2Ca_{n-1}Cu_nO_{2n+3}$ wherein n is 2, 3 or 4; and, $Tl_2Ba_2Ca_{n-1}Cu_nO_{2n+3}$ wherein n is 1, 2 or 3. The c-axis of the unit cell for these compounds is about 3.1 nm and they contain more than one copper-oxygen layer. The highest $T_c$ for this series is about 125° K. for $Tl_2Ba_2Ca_2Cu_3O_{10}$ which has a c-axis of the unit cell of 3.59 nm. Further information on thallium superconductors is in Torardi et al., Science, Vol. 240, pp. 631-633 (Apr. 29, 1988), herein incorporated by reference.

These superconducting compounds are three dimensionally bonded and are not readily cleavable. They are subject to shattering, reflecting the strong bonding between planes, and thus have different properties, such as fracture properties, when compared to previously etched prior art compounds.

For use herein, the superconductor can be in the form of a single crystal or a thin film on a substrate. Substrates suitable for use in the present invention include $SrTiO_3$, MgO, Ag or others commonly known in the art.

Etched features ranging from very small (10-25 nm wide) to larger than 1 μm wide can be generated. The etch rate can be dependent on the crystal perfection and purity. Nucleation can occur at defects or dopant sites on the crystal. The rate of etching is also affected by the microscope tip or probe. Microscope tip morphology is important. Etching occurs at either positive or negative tip biases.

Instrument operating parameters suitable for use in the process of the present invention include a tunneling current of up to about 100 nanoamps, and a voltage of from about −5 to +5 volts, excluding zero volts. The preferred tunneling current is less than 10 nanoamps, with the most preferred less than 2.0 nanoamps. The preferred voltage range is less than 2.0 volts.

An inert atmosphere can be employed but is not required in the process of the present invention. The etching can be conducted in an air atmosphere. A reduced pressure atmosphere is not needed in the present invention.

The advantage of the present invention is that the surface can be etched while being viewed at the same time allowing control over the etch pattern developed. Also using the invention described, very small features have been produced on both single crystals and thin films. In the case of thin films, the current transfer across such etched regions can be altered in a controlled way and in the limit a complete junction could be designed for use in quantum interference devices. For films the material can be etched down a controlled distance or down to the substrate and this nanoscale etching of these superconductors will be useful in constructing devices such as Josephson junctions and Ahranov-Bohm rings. The surface etching yields clean surfaces which on subsequent metallization will show reduced contact resistance. Surface treatment will also affect microwave properties, for example, in resonators.

The following examples illustrate the present invention but are not intended to limit it in any manner.

In the following examples of the process of the present invention the single crystals of $YBa_2Cu_3O_{7-x}$ superconductor were grown using CuO—BaO self-flux according to the procedure of T. Wolf et al., J. Crystal Growth, Vol. 96, pp. 1010-1018 (1989) which is herein incorporated by reference. The crystals were plated with typical dimensions of 1×1-2×0.1 mm. The larger faces were in ab planes. The crystals were thinner in the c-direction. The as grown crystals (in air) had a well defined superconducting transition, $T_c = 60$ K. as determined from flux exclusion. The superconducting transition can be raised to 90 K. by prolonged annealing in oxygen. The presence of the superconducting phase was also confirmed by X-ray diffraction. Thin films of $YBa_2Cu_3O_{7-x}$ were deposited in situ by laser ablation. The transition of the film was 88K and was very narrow (>1K).

In the following examples a Nanoscope II STM available from Digital Instruments of Santa Barbara, Calif., was employed with a platinum tip.

EXAMPLE 1

A single crystal of $YBa_2Cu_3O_{7-x}$ was etched by rastering with a platinum tip of the STM. A region of 3000×3000 nm was scanned. The tunneling voltage was 1581 mV and the tunneling current was 0.26 nA. On repeated scanning, material was etched from the surface, the holes growing until an entire layer was removed. The step height of this layer was measured to approximately 1.2 nm corresponding to the c-axis unit cell of the superconductor. On continued rastering the second layer began to etch. Nucleation and growth occurred from the edge of etch regions. The etch pattern created is shown in FIG. 1.

EXAMPLE 2

Figure 2A:
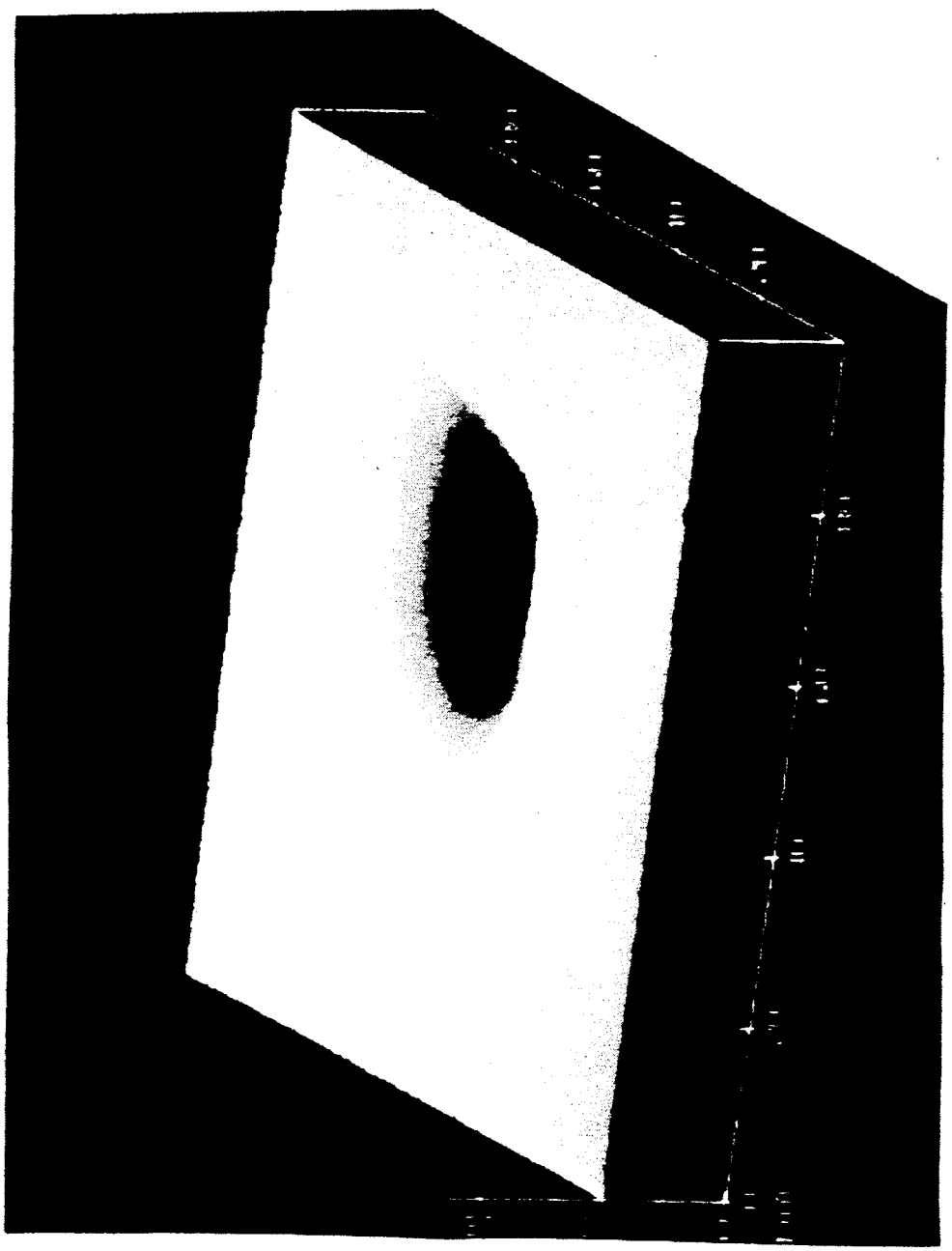
FIG. 2a shows the etch pattern created using a STM on a single crystal of $YBa_2Cu_3O_{7-x}$ resulting from Example 2.
Figure 2B:
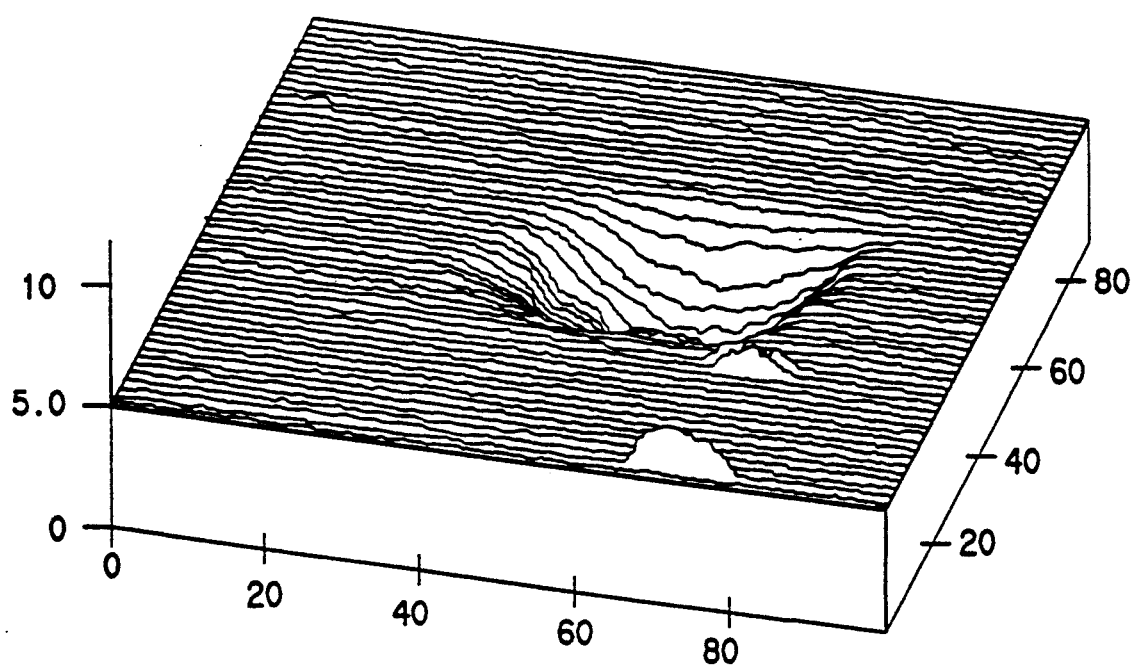
FIG. 2b shows the line profile of the etch pattern from Example 2. Nanoscope II parameters were bias 1272.9 mV, setpoint 1.1 nA, Z 20.0 Å/V, XY 17.6 Å/V and samples 400/scan.

A small feature was etched in the surface of a single crystal $YBa_2Cu_3O_{7-x}$. The tunneling voltage was 1272 mV and the tunneling current was 1.1 nanoamps. The region etched was about 300 nm wide. The depth of the etch, measured by profiling at constant current was about 3.6 nm and corresponds to three c-axis unit cells representing one of the smallest features etched using an STM. Etching was carried out in air. The etch pattern created is shown in FIG. 2a. FIG. 2b depicts the line profile of the pattern created.

EXAMPLE 3

Figure 3A:
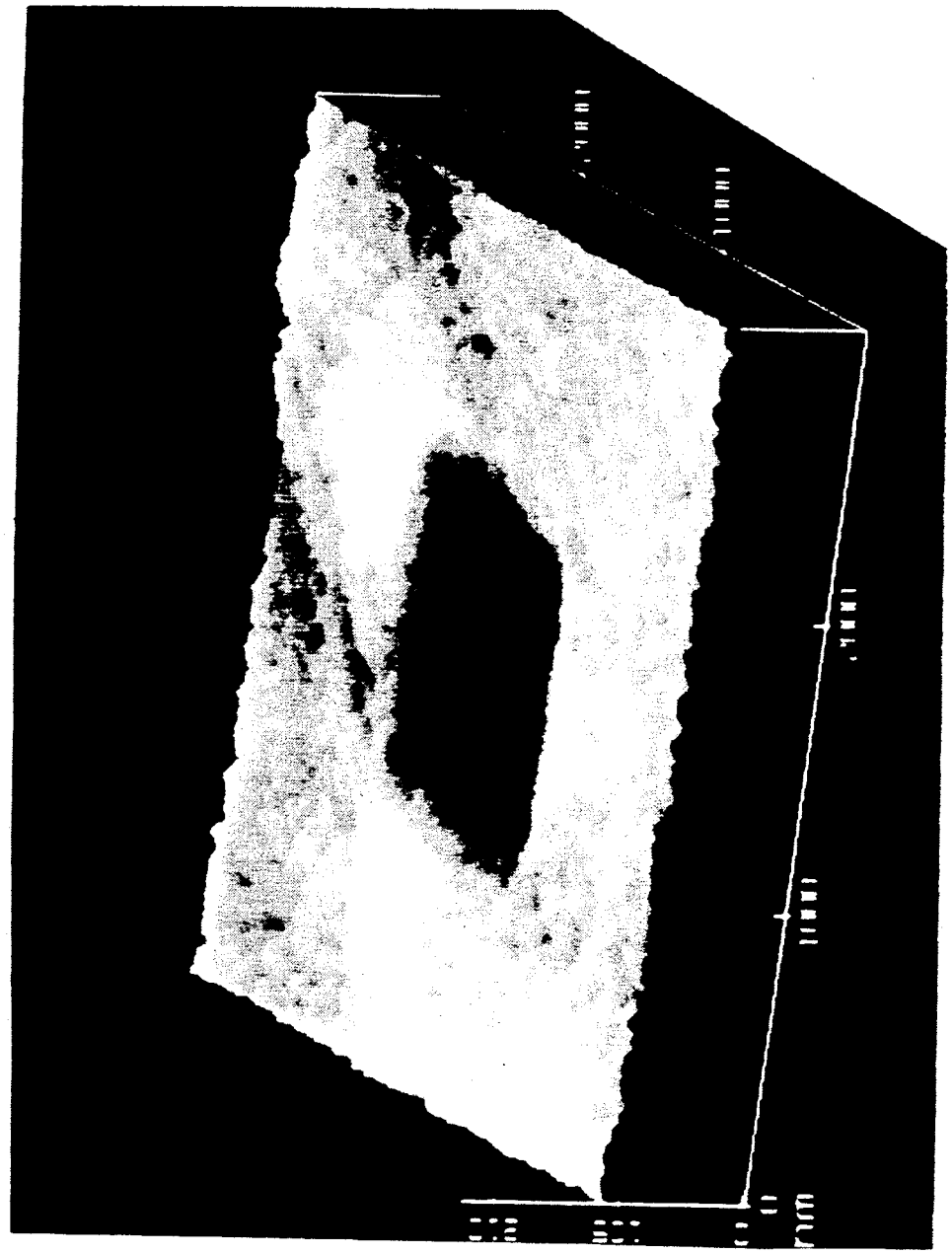
FIG. 3a shows the etch pattern created using a STM on a thin film of $YBa_2Cu_3O_{7-x}$ resulting from Example 3.
Figure 3B:
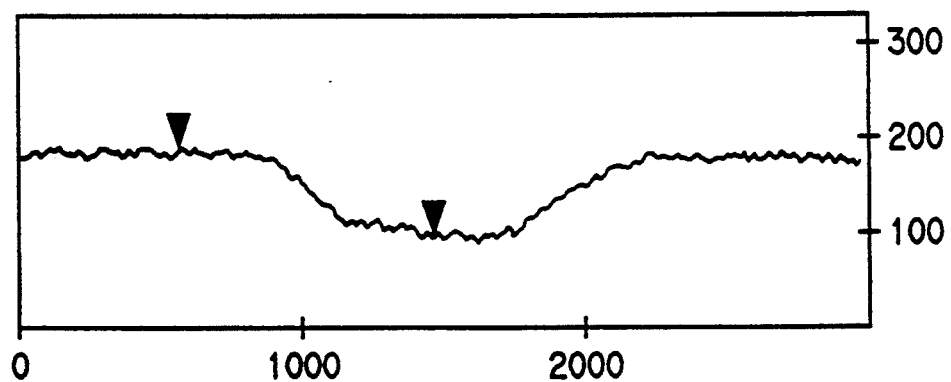
FIG. 3b shows a cross-section of the etching of Example 3. The horizontal distance was 915.00 nm, the vertical distance was 95.32nm, and the angle 5.95 degrees.

A highly oriented thin film of $YBa_2Cu_3O_{7-x}$ ($T_c = 88K$) was etched by repeated rastering with the tip for 30 minutes. The tunneling voltage was −2550 mv and the tunneling current was 0.897 nanoamps. The area etched was 1000×1000 nm and 100 nm deep showing a relatively large etch pit created. The film was deposited on a magnesium oxide substrate. FIG. 3a shows the etch pattern created. FIG. 3b shows a cross-section profile of the etched region.

EXAMPLE 4

Figure 4:
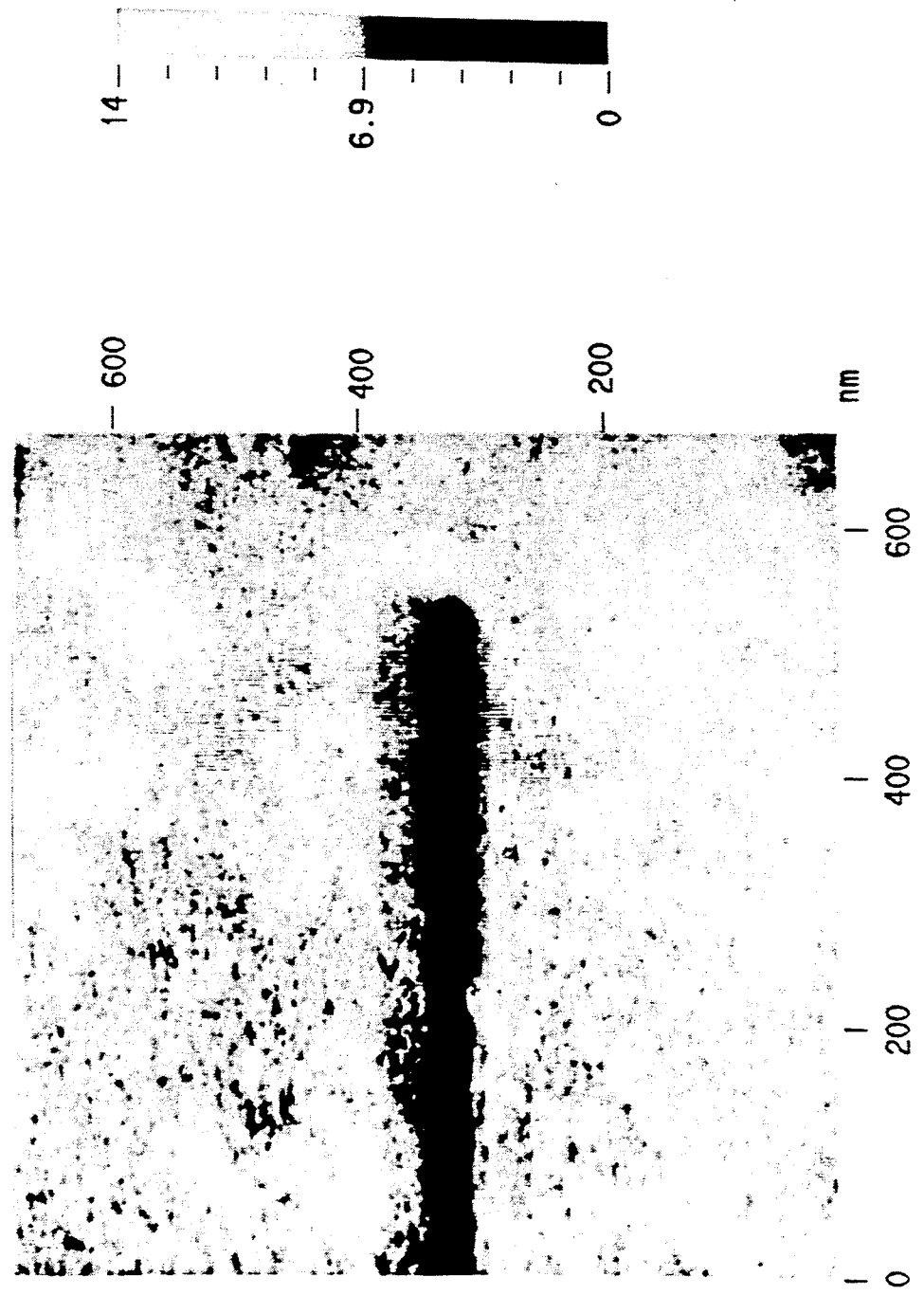
FIG. 4 shows the etch pattern created using a STM on a single crystal of $YBa_2Cu_3O_{7-x}$ resulting from Example 4.

A well defined line was etched on a single crystal of the $YBa_2Cu_3O_{7-x}$. The tunneling voltage was 1099.9 mV and the tunneling current was 1.0 nanoamps. The region etched was about 10 nm wide, 500 nm long, and 2.2 nm deep. The depth of the etch corresponds to two c-axis unit cells. Etching was carried out in air. The etch pattern created is shown in FIG. 4. This example shows the versatility of the technique to define patterns of unlimited shape on these materials.

EXAMPLE 5

Figure 5:
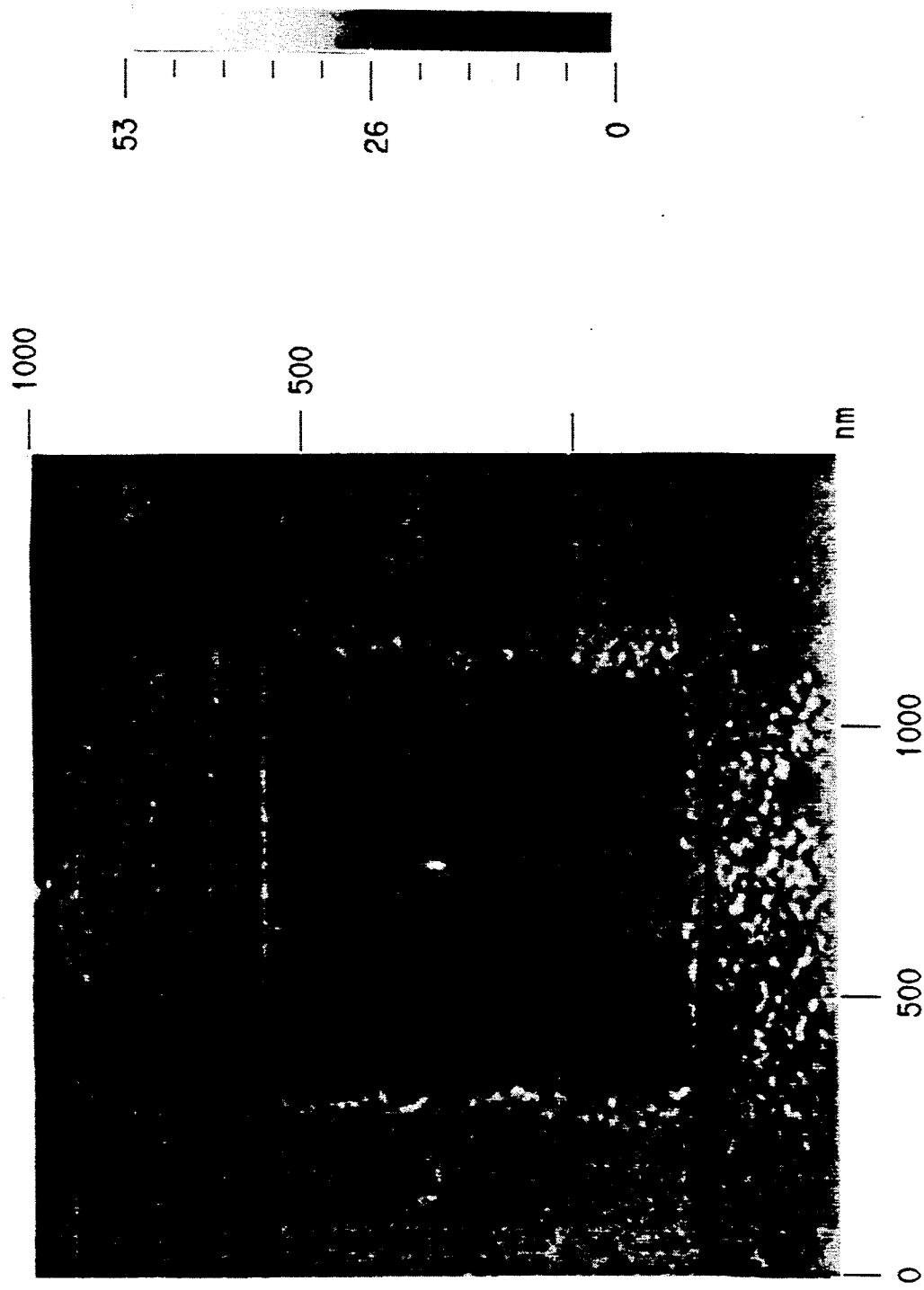
FIG. 5 shows the etch pattern created using a STM on a single crystal of $Bi_2Sr_2CaCu_2O_8$ resulting from Example 5.

A small feature was etched in the surface of a single crystal of $Bi_2Sr_2CaCu_2O_8$. The tunneling voltage was 1626 mV and the tunneling current was 0.17 nanoamps. The region etched was about 100 nm wide. The depth of the etch was about 1.2 nm, less than the c-axis unit cell, representing one of the smallest features etched using an STM. Etching was carried out in air. The etch pattern created is shown in FIG. 5.

What is claimed is:

1. A process for controlled etching of a structure using a scanning tunneling microscope comprising scanning the microscope tip over a high temperature superconductor having three dimensional bonding at a voltage of from about −5 to less than +2.0 volts excluding zero volts and a current of less than 10 nanoamps to generate the continuous controlled ablation of one or more layers of the superconductor, wherein the etched structure can be viewed simultaneously with the ablation.

2. The process of claim 1 wherein a single layer is ablated.

3. The process of claim 1 wherein more than one layer is ablated simultaneously.

4. The process of claim 1 wherein the superconductor comprises a copper-oxide superconductor.

5. The process of claim 1 wherein the superconductor comprises $YBa_2Cu_3O_{7-x}$ wherein x is 0 to about 1, $La_{2-x}Sr_xCuO_4$ wherein x is from about 0.1 to about 0.2, $Bi_2Sr_{3-x}Ca_{n-2+x}Cu_nO_{2n+4}$ wherein n is 2 or 3 and x is from about 0.7 to about 1, $TlBa_2Ca_{n-1}Cu_nO_{2n+3}$ wherein n is 2, 3, or 4, or $Tl_2Ba_2Ca_{n-1}Cu_nO_{2n+3}$ wherein n is 1, 2 or 3.

6. The process of claim 5 wherein the superconductor comprises $YBa_2Cu_3O_{7-x}$.

7. The process of claim 6 wherein the depth of the etched structure is controlled to a precision of 1.2 nm.

8. The process of claim 5 wherein the superconductor comprises $Bi_2Sr_2CaCu_2O_8$.

9. The process of claim 1 wherein the structure etched can be viewed simultaneously with its creation.

10. The process of claim 1 wherein the superconductor remains free of deformation or residue.

11. The process of claim 1 wherein the superconductor comprises a single crystal.

12. The process of claim 1 wherein the superconductor comprises a thin film.

13. The process of claim 1 wherein the scanning is conducted at a current of less than 10 nanoamps and a voltage of less than 2.0 volts.

* * * * *